(12) United States Patent
Jeon

(10) Patent No.: US 9,363,903 B2
(45) Date of Patent: Jun. 7, 2016

(54) SUPPORTING MEMBER FOR ATTACHING FUNCTIONAL PANEL TO DISPLAY PANEL, DISPLAY DEVICE HAVING THE SAME, AND METHOD FOR FABRICATING DISPLAY DEVICE

(71) Applicant: LG DISPLAY CO., LTD., Seoul (KR)

(72) Inventor: SeHwan Jeon, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 547 days.

(21) Appl. No.: 13/725,734

(22) Filed: Dec. 21, 2012

(65) Prior Publication Data

US 2013/0301123 A1 Nov. 14, 2013

(30) Foreign Application Priority Data

May 8, 2012 (KR) .................. 10-2012-0048796

(51) Int. Cl.
*H05K 5/00* (2006.01)
*G02B 27/22* (2006.01)
*H05K 5/02* (2006.01)

(52) U.S. Cl.
CPC .......... *H05K 5/0017* (2013.01); *G02B 27/2228* (2013.01); *H05K 5/02* (2013.01); *G02B 27/2214* (2013.01); *Y10T 428/24612* (2015.01)

(58) Field of Classification Search
CPC ................. H05K 5/0017; G09F 2007/1847
USPC ........................................ 359/464
See application file for complete search history.

(56) References Cited

U.S. PATENT DOCUMENTS

| 2003/0202135 | A1 | 10/2003 | Ono et al. |
| 2008/0002135 | A1 | 1/2008 | Ahn |
| 2012/0229719 | A1* | 9/2012 | Ishiguro ................. 349/15 |
| 2012/0253061 | A1* | 10/2012 | Takahashi .............. 560/158 |
| 2013/0135720 | A1* | 5/2013 | Naske et al. ............ 359/464 |
| 2013/0314863 | A1* | 11/2013 | Tanaka ................. 361/679.01 |

FOREIGN PATENT DOCUMENTS

| CN | 1453613 A | 11/2003 |
| CN | 101097337 A | 1/2008 |
| JP | 2009-294280 A | 12/2009 |
| KR | 10-2008-0013479 A | 2/2008 |

* cited by examiner

*Primary Examiner* — Bumsuk Won
*Assistant Examiner* — Grant Gagnon
(74) *Attorney, Agent, or Firm* — Birch, Stewart, Kolasch & Birch, LLP

(57) ABSTRACT

A display device according to the present disclosure includes a display panel to output an image thereon, a functional panel attached onto the display panel by use of an adhesive, a supporting member disposed on one side of the display panel, and having a partial area disposed between the display panel and the functional panel to maintain a uniform gap between the display panel and the functional panel, and at least one adhesive introduction space formed on the supporting member such that an adhesive is introduced therein, the adhesive filled between the display panel and the functional panel.

13 Claims, 5 Drawing Sheets

SUPPORTING MEMBER FOR ATTACHING FUNCTIONAL PANEL TO DISPLAY PANEL, DISPLAY DEVICE HAVING THE SAME, AND METHOD FOR FABRICATING DISPLAY DEVICE

CROSS-REFERENCE TO RELATED APPLICATION

Pursuant to 35 U.S.C. §119(a), this application claims the benefit of earlier filing date and right of priority to Korean Application No. 10-2012-0048796, filed on May 8, 2012, the contents of which is incorporated by reference herein in its entirety.

BACKGROUND OF THE INVENTION

1. Field of the Invention

This specification relates to a supporting member for attaching (or bonding) a functional panel, a display device having the same and a method for fabricating the display device, and particularly, to a supporting member for attaching a functional panel, capable of evenly coating an adhesive layer all over a display panel by forming a space on a supporting member for maintaining a uniform gap between the functional panel and the display panel and allowing an adhesive to be introduced into the space to attach a functional panel and the display panel to each other when the function panel and the display panel are attached to each other, and a liquid crystal display (LCD) device having the same.

2. Background of the Invention

Recently, the development of various types of portable electric equipment, such as mobile phones, personal digital assistants (PDAs), and notebook computers, is increasing the demands on flat panel display devices, which are applicable to those equipment and small in size, light in weight and power-efficient. Examples of the flat panel display device are a liquid crystal display (LCD) device, a plasma display panel (PDP) device, a field emission display (FED) device, a vacuum fluorescent display (VFD) device and the like. Studies on those devices are actively conducted.

Meanwhile, a personal computer, a portable communication device and other personal information processing devices generally construct interfaces with users using various input devices, such as a keyboard, a mouse, a digitizer and the like. However, as the development of portable electronic devices extends, the input of information into the portable electronic devices is unable to be carried out merely by those input devices such as the keyboard or the mouse. This leads to proposing a display device capable of facilitating a user to input information by attaching a touch panel, which the user directly touches its screen with a finger or pen to input information, onto a liquid crystal panel.

Also, a display device providing a hyperspace Three-Dimensional (3D) stereoscopic image, which appears realistic and stereoscopic beyond time and space, in addition to a simple 2D image, is proposed. This stereoscopic image display device displays a stereoscopic image by attaching parallax barriers or 3D Film Patterned Retarder (FPR) onto a front surface of a display panel to divide an image displayed on the display panel into an image for a left eye and an image for a right image, and thus transferring the different images to the left and right eyes.

The flat display panel may be used as a display device with various functions by attaching a variety of functional panels, such as a touch panel, parallax barriers, 3D FPR or the like, onto its front surface.

The display panel and the functional panel are attached to each other by an adhesive made of transparent resin or the like. However, when a uniform distance is not maintained between the display panel and the functional panel or the adhesive is not uniformly coated upon attaching the display panel and the functional panel onto each other, an optical path may change due to a difference of thickness, causing a defect, such as color shifting.

SUMMARY OF THE INVENTION

Therefore, an aspect of the detailed description is to provide a supporting member, which is disposed between a display panel and a functional panel so as to maintain a uniform gap therebetween when the display panel and the functional panel are attached onto each other.

Another aspect of the detailed description is to provide a display device having the supporting member.

Another aspect of the detailed description is to provide a method for attaching a display panel and a functional panel onto each other using the supporting member.

To achieve these and other advantages and in accordance with the purpose of this specification, as embodied and broadly described herein, there is provided a display device including a display panel for displaying an image; a functional panel attached onto the display panel by an adhesive; a supporting member at one side of the display panel, a partial area of the supporting member disposed between the display panel and the functional panel to maintain a uniform gap between the display panel and the functional panel; and at least one adhesive introduction space formed at the supporting member so that an adhesive filled between the display panel and the functional panel is introduced into the adhesive introduction space.

The functional panel may include a Three-Dimensional Film Patterned Retarder (3D FPR) and a parallax barrier. The supporting member may include a first region located on a pad region of the display panel, and a second region located between the display panel and the functional panel. Here, a width of the second region may be smaller than a gap between the display panel and the functional panel such that the adhesive is introduced between the second region and the functional panel. The supporting member may be made of polyethylene terephthalate.

To achieve these and other advantages and in accordance with the purpose of this specification, as embodied and broadly described herein, there is provided a method for fabricating a display device including providing a display panel and a functional panel; forming an adhesive pattern by coating an adhesive on at least one surface of the display panel and the functional panel; assembling the display panel, the functional panel and a supporting member such that a part of the supporting member is disposed between the display panel and the functional panel; and spreading the adhesive of the adhesive pattern in whole area of the display panel and the functional panel by applying pressure onto the display panel and the functional panel, wherein a part of the adhesive reaching the supporting member is introduced into a recess unit formed on the supporting member so that the adhesive is uniformly spread on the display panel and the functional panel.

In accordance with the present disclosure, a recess unit in which an adhesive is introduced may be formed on a supporting member which balances pressure applied when a display panel and a functional panel are bonded to each other, which may allow the adhesive with high viscosity to be uniformly coated on an entire region between the display panel and the functional panel, resulting in minimizing degradation of image quality or likelihood of destroying a display device.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Figure 1:
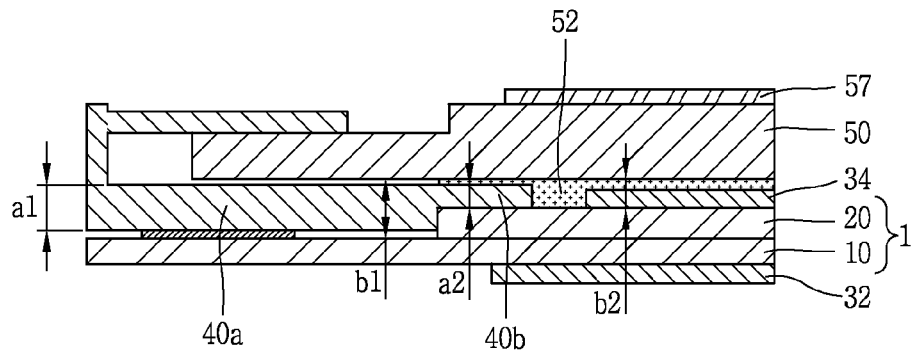
FIG. 1 is a sectional view showing a structure of a display device in accordance with the present disclosure.

FIG. 1 is a sectional view showing a structure of a display device in accordance with the present disclosure.

As shown in FIG. 1, a display device according to the present disclosure may include a display panel 1 formed by bonding a first substrate 10 and a second substrate 20 to represent an image, a functional panel 50 attached onto a front surface of the display panel 1, namely, onto the second substrate 20 by use of a transparent resin adhesive layer 51, and a supporting member disposed on one side of the display panel 1 with being partially interposed between the display panel 1 and the functional panel 50 to maintain a uniform gap between the functional panel 50 and the display panel 1.

The display panel 1 is a flat display panel, and may be implemented by various types of display panels, such as a Liquid Crystal Display panel, an Organic Electroluminescent Display (OLED) panel and the like. Although not shown, when the display panel 1 is the LCD panel, the first substrate 10 may include a plurality of gate lines and data lines arranged horizontally and vertically to define a plurality of pixel regions, a Thin Film Transistor (TFT) as a switching device formed on each pixel region, and a pixel electrode formed on each pixel region. Also, each TFT may include a gate electrode connected to the gate line, a semiconductor layer formed by depositing amorphous silicon and the like on the gate electrode, and a source electrode and a drain electrode formed on the semiconductor layer and connected to the data line and the pixel electrode.

The second substrate 20 may include a color filter having a plurality of sub color filters for representing Red (R), Green (G) and Blue (B) colors, and a black matrix for dividing the sub color filters from each other and blocking light transmitted through a liquid crystal layer.

The thusly configured first substrate 10 and the second substrate 20 may be bonded to each other by a sealant (not shown) formed along edges of an image display region in a state of facing each other, thereby configuring a liquid crystal panel.

Here, the first substrate 10 may be larger than the second substrate 20 in area. Accordingly, at least one region of the first substrate 10 may extend from a side of the second substrate 20 to form a pad region on the first substrate 10. On this pad region may be mounted various driving devices (not shown) such as a data driving unit or a gate driving unit, so as to apply signals into the display panel.

When the display panel 1 is a Liquid Crystal Display (LCD) panel, a first polarizer 32 and a second polarizer 34 may be attached onto upper and lower surfaces (or front and rear surfaces) of the LCD panel, changing a polarized state of light which is inputted into or outputted from the LCD panel.

When the display panel 1 is an Organic Electroluminescent Display (OLED) panel, an organic light emitting layer may be formed on the first substrate 10 or the second substrate 20. Accordingly, in response to a signal input, light is emitted from the organic light emitting layer to represent an image. Here, unlike the transparent LCD panel, the OLED panel is a self-emitting display panel, so it does not need a polarizer.

The functional panel 50 may be implemented by applying a variety of panels, such as a 3D Film Patterned Retarder (FPR) or a parallax barrier panel for implementing a stereoscopic image, a touch panel for facilitating an information input, and the like.

The functional panel 50 may be attached onto the display panel 1 by the adhesive layer 52. The adhesive layer 52 may be made of transparent resin. However, the adhesive layer 52 may be made of any material if it is transparent and able to output light emitted from the display panel 1 without a change in an optimal path such as refraction or the like or changes in optimal characteristics.

A gap maintaining supporting member 40 may be disposed on one side or both sides of the display panel 1 to maintain a uniform gap between the functional panel 50 and the display panel 1. As shown in the drawing, the supporting member 40 may include two regions 40a and 40b. The first region 40a may be located between the pad region of the display panel 1 and the functional panel 50, and the second region 40b may be located between the second substrate 20 of the display panel 1 and the functional panel 50.

A gap (width) b1 between the pad region and the function panel 50 may be greater than a gap (width) b2 between the second substrate 20 and the functional panel 50 (i.e., b1>b2). Hence, a thickness a1 of the first region 40a of the supporting member 40, which is located between the pad region and the functional panel 50 may be greater than a thickness a2 of the second region 40b of the supporting member 40, which is located between the second substrate 20 of the display panel 1 and the functional panel 50 (i.e., a1>a2).

The thickness a2 of the second region 40b of the supporting member 40 may be formed variously if necessary. However, to minimize the thickness of a completely fabricated display device, the thickness a2 of the second region 40b may preferably be smaller than or the same as the thickness of the second polarizer 34 attached onto the second substrate 20 of the display panel 1.

That is, as the second polarizer 34 is attached onto the second substrate 20, the display panel 1 and the functional panel 50 may be bonded to each other with a predetermined gap. When the second region 40b of the supporting member 40 is thinner than the second polarizer 34 in thickness, it may prevent an increase in the thickness of the function panel 50 when the second region 40b is disposed between the display panel 1 and the functional panel 50.

As such, the reason of installing the gap maintaining supporting member 40 between the display panel 1 and the functional panel 50 may be as follows.

Figure 2A:
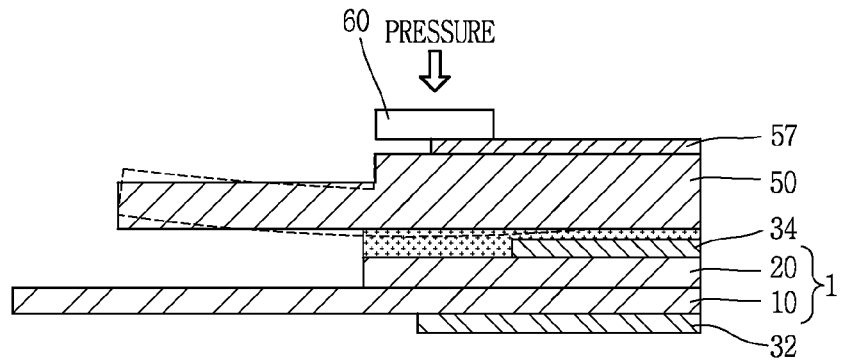
FIG. 2A is a view showing an attached state between a display panel and a functional panel when no supporting member is present.

As shown in FIG. 2A, to attach the display panel 1 and the functional panel 50 to each other, the adhesive layer 52 is first formed between the display panel 1 and the functional panel 50, and pressure is applied onto the display panel 1 and the functional panel 50. In order to prevent a force from being applied directly onto the functional panel 50 when the pressure is applied, the pressure may be applied after placing a pad 60 on the functional panel 50.

The pad 60 may be formed along an edge region of the functional panel 50. When pressure is applied onto the pad 60, a gap between the display panel 1 and the functional panel 50 located below the pad 60 is reduced due to the applied pressure. Here, since the pressure is concentrated on one region, the function panel 50 may be bent in an opposite direction to the pressure-applied direction (i.e., upwardly) as getting farther away from the region where the pad 60 is located. This may result in an increase in the gap between the display panel 1 and the functional panel 50 as getting farther away from the region where the pad 60 is located.

Consequently, the overall gap between the display panel 1 and the functional panel 50 may not maintain uniformly due to the pressure applied. This may cause an image, which is displayed on the display panel 1, to be distorted while being transmitted between the display panel 1 and the functional panel 50 with the non-uniform gap therebetween. An image quality may thusly be lowered and the functional panel 50 may be highly likely to be damaged.

Figure 2B:
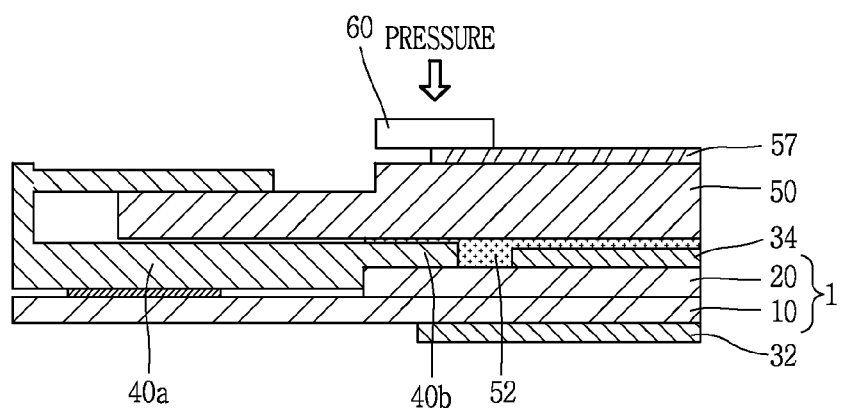
FIG. 2B is a view showing an attached state between a display panel and a functional panel when a supporting member is present.

However, as shown in FIG. 2B, according to the present disclosure, pressure is applied after the supporting member 40 is interposed between the display panel 1 and the functional panel 50. Hence, the functional panel 50 may be supported by the supporting member 40 such that the pressure may be distributed (spread) to the overall functional panel 50. This may prevent the gap between the display panel 1 and the functional panel 50 from being reduced due to the pressure.

In accordance with the present disclosure, after forming the adhesive layer between the display panel 1 and the functional panel 50 and laying the supporting member 40 along the edge region between the display panel 1 and the functional panel 50, pressure is applied onto the display panel 1 and the functional panel 50 to attach them to each other. This may prevent an occurrence of a defect, such as lowering of an image quality or the like, due to unbalancing between the display panel 1 and the functional panel 50 caused by the pressure.

The adhesive layer 52 may be formed between the second region 40b of the supporting member 40 and the functional panel 50 as well as between the display panel 1 and the functional panel 50. Here, since the adhesive layer 52 may be filled in the space between the second region 40b and the functional panel 50, the display panel 1 and the functional panel 50 may be prevented from being moved due to tolerance. Also, the second region 40b and the functional panel 50 may serve to absorb an externally applied impact, thereby preventing a display device from being destroyed due to the external impact.

Also, referring back to FIG. 1, a protection film 57 may be attached onto an upper surface of the functional panel 50 of the bonded display device. The protection film 57 may prevent permeation of impurities such as moisture from the outside and absorb an externally applied impact by virtue of existence of elasticity more than a predetermined value. This may result in prevention of destroy of the display device due to the external impact.

Figure 3:
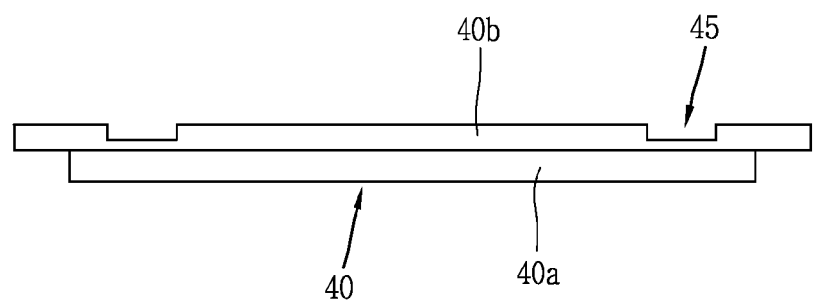
FIG. 3 is a planar view showing the structure of the supporting member.

FIG. 3 is a planar view showing the structure of the supporting member in more detail. The supporting member 40 may be made of various materials, but usually made of polyethylene terephthalate.

Referring to FIG. 3, the supporting member 40 may include the first region 40a and the second region 40b. When the supporting member 40 is assembled with the display panel 1 and the functional panel 50, the first region 40a may be located between the pad region of the display panel 1 and the functional panel 50 and the second region 40b may be located between the second substrate 20 of the display panel 1 and the functional panel 50. When pressure is applied to the display panel 1 and the functional panel 50, a region to which the pressure is actually transferred to be spread all over the supporting member 40 may be the second region 40b.

Here, the thickness a1 of the first region 40a of the supporting member 40 may be greater than the thickness a2 of the second region 40b (i.e., a1>a2), and the thickness a2 of the second region 40a may be greater than the gap b2 between the second substrate 20 of the display panel 2 and the functional panel 50 (i.e., a2>b2). As such, when the thickness a2 of the second region 40b is greater than the gap b2 between the second substrate 20 of the display panel 1 and the functional panel 50, the supporting member 40 may be simply located between the display panel 1 and the functional panel 50 and additionally a predetermined gap may be formed between the functional panel 50 and the supporting member 40. This may allow an adhesive to be introduced between the functional panel 50 and the supporting member 40 when the display panel 1 and the functional panel 50 are attached to each other, thereby allowing the adhesive to be uniformly coated all over between the functional panel 50 and the supporting member 40. It will be described in more detail in an assembling method to be explained later.

A plurality of recess units 45 may be formed on the second region 40b of the supporting member 40. The recess units 45 may be filled with the adhesive when the adhesive is coated. The formation of the recess units 45 on the supporting member 40 may prevent the adhesive from being unevenly coated on the entire region between the display panel 1 and the functional panel 50, which may be caused by the adhesive being unable to be introduced into the gap between the second region 40b of the supporting member 40 and the functional panel 50 due to its high viscosity when the adhesive is coated all over between the display panel 1 and the functional panel 50.

That is, with the presence of the recess units 45, the adhesive may be introduced into the recess units 45 even when the adhesive is unable to be spread into the gap between the second region 40a of the supporting member 40 and the functional panel 50 due to its viscosity. This may result in forming the adhesive layer 52 on the entire region between the display panel 1 and the functional panel 50.

FIG. 3 shows only two of the recess units 45, but one or more than 3 recess units 45 may be formed. Also, the recess unit 45 may be formed in various shapes. For example, the recess unit 45 may be formed by removing the second region 40b of the supporting member 40 as deep as the entire thickness or as deep as a part of the thickness. Also, the recess unit 45 may be formed in various shapes, such as a rectangular shape, a curved shape and the like.

The recess unit 45 may also be formed in various sizes. The recess unit 45 is a region in which the adhesive is introduced when the display panel 1 and the functional panel 50 are bonded to each other. Hence, the recess unit 45 may be designed variously according to sizes of the display panel 1 and the functional panel 50, an amount of adhesive coated, viscosity of the adhesive, strength of pressure applied onto the display panel 1 and the functional panel 50 and the like.

Hereinafter, a method of assembling a display device in accordance with the present disclosure will be described in detail.

Figure 4A:
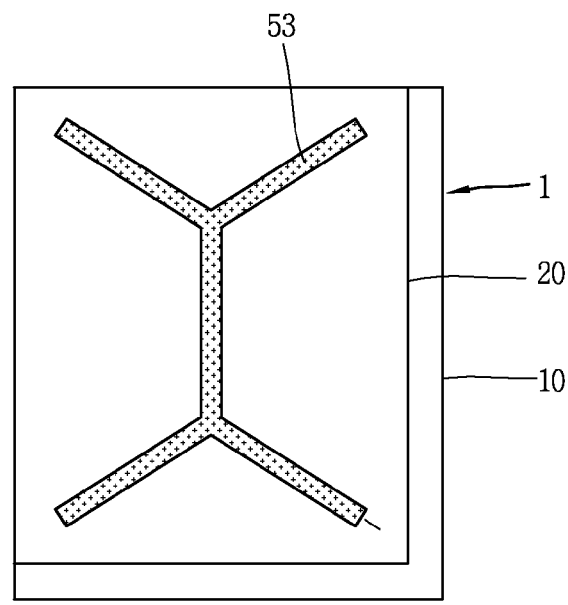
FIGS. 4A to 4F are views showing a method for fabricating a display device in accordance with the present disclosure.

FIGS. 4A to 4F are views showing a method for assembling a display device according to the present disclosure. First, as shown in FIG. 4A, a display panel 1 is prepared. The display panel 1 may include a flat display panel such as an LCD panel, an OLED panel and the like. Those flat display panels may be completely fabricated through their own fabrication processes. For example, for the LCD panel, TFTs, various signal lines and electrodes are formed on a first substrate through a TFT fabricating process, a black matrix and a color filter layer are formed on a second substrate through a color filter fabricating process, and the first substrate and the second substrate are bonded with a liquid crystal layer interposed therebetween through a bonding process.

Also, when the display panel is the OLED panel, TFTs, various signal lines and electrodes are formed on a first substrate through a TFT process, an organic light emitting layer, an electron injection layer and a hole injection layer for injecting electrons and holes respectively into the organic light emitting layer, and an electron transfer layer and a hole transfer layer for transferring the injected electrons and holes to the organic light emitting layer are formed through an electroluminescence fabricating process, a protection film such as polystyrene (PS) film, polyethylene (PE), polyethylene naphthalate (PEN) film or polyimide (PI) film are bonded on a substrate through a bonding process.

As shown in FIG. 4A, an adhesive 53 may be coated on an upper surface of the prepared display panel 1 in a predetermined pattern. The coated adhesive 53 may be outwardly spread on the upper surface of the display panel so as to be coated all over the display panel 1. Any material may be employed as the adhesive if it is transparent and does not cause changes in optical characteristics or luminance. The present disclosure may use transparent thermosetting resin or UV-curing resin, such as epoxy-based compound, acrylate-based compound or acryl-based rubber, as the adhesive 53.

In the drawing, as the adhesive pattern forms a gull shape on an upper or lower surface of the display panel 1, the adhesive 53 may be entirely spread toward the edge region of the display panel 1 during the same period of time. The adhesive pattern may not be limited to a specific pattern but be determined as a shape for allowing the adhesive to be spread over the entire region of the display panel 1 for the same period of time by taking into account characteristics, such as size and shape of the fabricated display panel 1, viscosity of the adhesive 53 and the like.

The drawing shows that the adhesive pattern is formed on the upper surface of the display panel 1. However, the adhesive pattern may alternatively be formed on the functional pattern 50 or formed on both the display panel 1 and the functional panel 50.

Figure 4B:
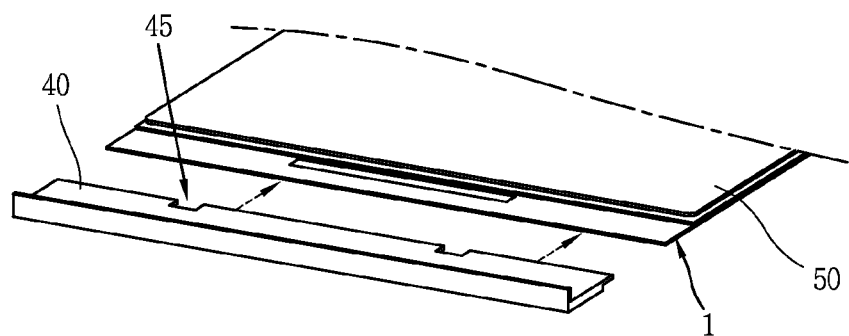

After coating the adhesive 53 in the specific pattern, referring to FIG. 4B, the functional panel 50 may be laid on the display panel 1, and then the supporting member 40 may be inwardly inserted and assembled from one side of the display panel 1 and the functional panel 50. Here, the second region 40b of the supporting member 40 shown in FIG. 3 may be located between the functional panel 50 and the display panel 1, and the first region 40a may be located between the pad region of the display panel 1.

Figure 4C:
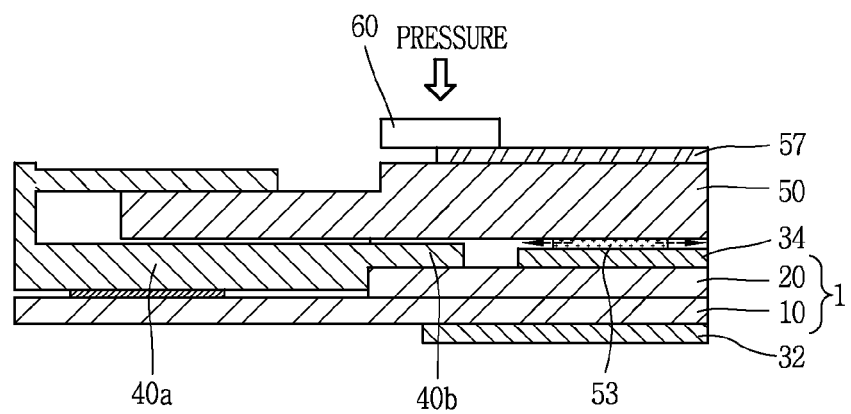

Referring to FIG. 4C, after laying the pad 60 on the functional panel 50, pressure is applied onto the pad 60 to bond (attach) the functional panel 50 and the display panel 1 to each other. Although not shown, the bonding of the display panel 1 and the functional panel 50 may be carried out on a bonding table. The bonding table may be constantly maintained horizontally to allow uniform pressure to be applied onto the overall region of the functional panel 50 during the bonding process.

Figure 4D:
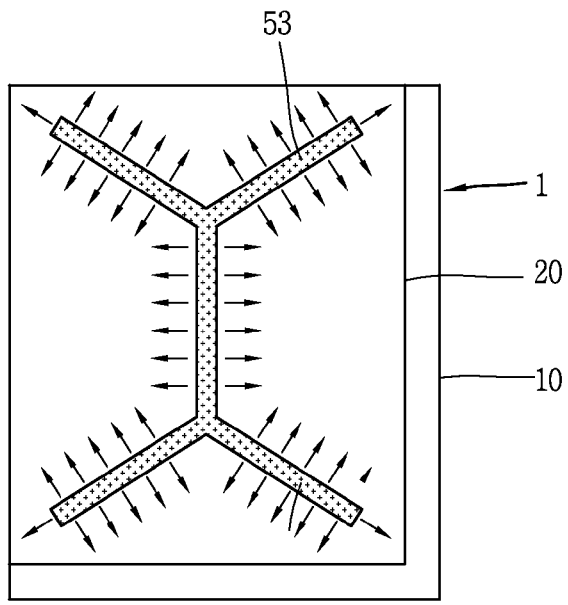

Referring to FIG. 4D, as the pressure is applied onto the functional panel 50, the adhesive 53 which has been coated in the specific pattern between the display panel 1 and the functional panel 50 is spread outwardly. Of course, the adhesive 53 may be spread toward the edge of the display panel 1 even in a state that pressure is not applied. However, when any external force is not applied, there may be a limit to forming an adhesive layer because spreading speed of the adhesive is very slow due to viscosity of the adhesive more than a predetermined level. Therefore, the adhesive layer may actually be formed over an entire display panel 1 by applying pressure.

Figure 4E:
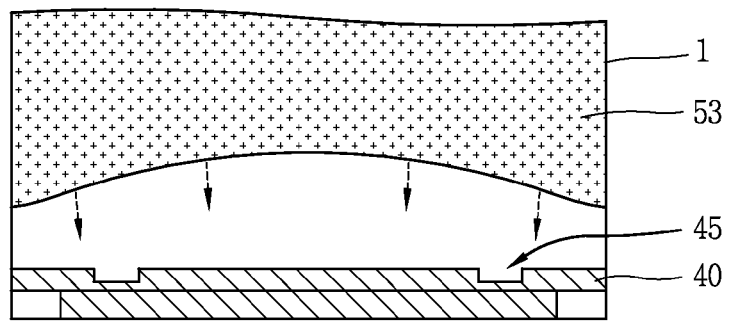
Figure 4F:
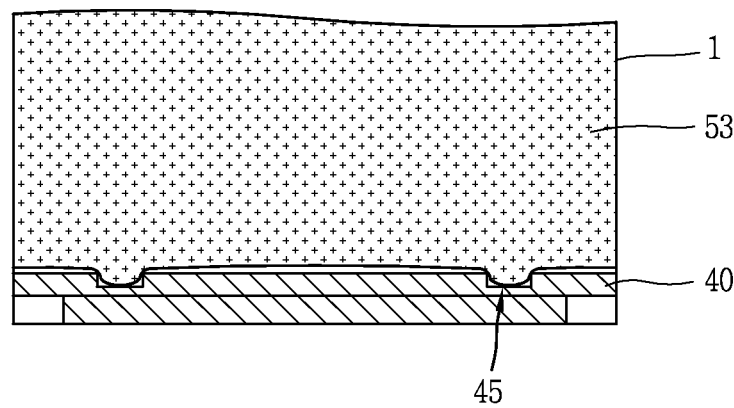

FIGS. 4E and 4F show that the adhesive 53 is spreading in response to the pressure being applied. For the sake of explanation, the edge region of the display panel 1, namely, the display panel 1 only on a region where the supporting member 40 is located and the supporting member 40 are shown in an enlarged state.

Referring to FIG. 4E, as pressure is applied onto the functional panel 50, the adhesive 53 is spreading outwardly. Here, the adhesive 53 may be spread in an arcuate shape due to the initial adhesive pattern when it is viewed from the side of the display panel 1 where the supporting member 40 is located, namely, both side portions of the spreading adhesive 53 may be spread more toward an end portion of the display panel 1 than a central portion of the adhesive 53.

Referring to FIG. 4F, when the adhesive 53 is spread close to the end portion of the display panel 1, the adhesive 53 may be partially introduced into a gap formed between the functional panel 50 and the supporting member 40 (see FIG. 2B), and partially introduced into the recess units 45 of the supporting member 40.

Figure 5:
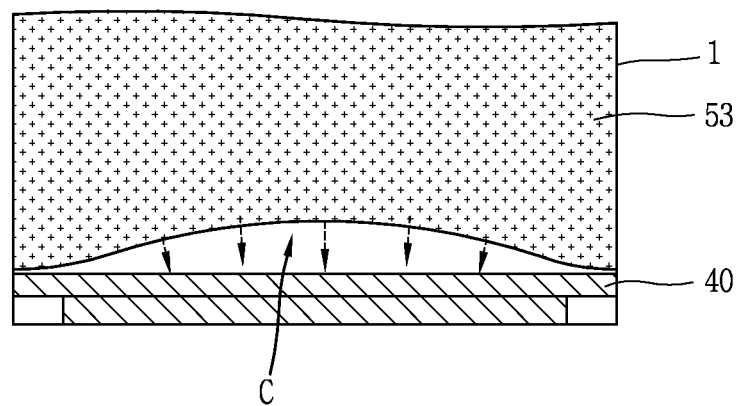
FIG. 5 is a view showing a state that an adhesive is coated when a recess is not formed on the supporting member.

Referring to FIG. 4E, the adhesive 53 may be spread in an arcuate shape, when viewed from the side of the display panel 1, namely, the both side portions in the arcuate shape being spread closer to the end portion of the display panel 1 than the central portion. The spreading speed is almost the same at the central portion and the both side portions of the adhesive. Hence, when the recess units 45 are not formed on the supporting member 40, the adhesive 53 may not be spread any more after its both side portions contact the supporting member 40. This may result in generation of a region C on which the adhesive 53 is not coated as shown in FIG. 5. However, this region belongs to a region for displaying an actual image on the display panel 1. When the adhesive layer 52 is not formed on the region C, a region with the adhesive layer 52 and the region C without it may exhibit different optical characteristics, such as optical paths and luminance, causing image quality to be defective.

Of course, the central portion of the adhesive 53 may be continuously spread to reach the supporting member 40 after the both side portions of the adhesive 53 contact the supporting member 40. But in reality, when both side portions of the adhesive 53 contact the supporting member 40 and stop spread due to high viscosity of the adhesive 53 and a surface tension of the adhesive 53, the spreading of the adhesive 53 at the central portion may be stopped as well.

Also, since the adhesive 53 contacting the supporting member 40 is introduced into the gap between the functional panel 50 and the supporting member 40, the adhesive 53 may be continuously spread at this region, and accordingly the central portion of the adhesive 53 is continuously spread. However, since the gap between the functional panel 50 and the supporting member 40 is fine and also the adhesive 53 has high viscosity, there is a limit to the introduction of the adhesive 53 into the gap between the functional panel 50 and the supporting member 40. Therefore, when the recess units 45 are not formed, the adhesive layer 52 may not be formed on a part of an image display region of the display panel 1. This may cause an image quality to be lowered.

However, in the present disclosure, the recess units 45 may be formed on the supporting member 40. This may allow the adhesive 53 to be introduced via the recess units 45 after the both side portions of the adhesive 53 contact the supporting member 40. Therefore, the central portion of the adhesive 53 may be continuously spread to completely contact the supporting member 40, forming the uniform adhesive layer 52 on the entire display panel 1.

In the meantime, the drawing shows that the recess units 45 are formed on both side portions of the second region 40b but may alternatively be formed on a central portion of the second region 40b. The formation of the recess units 45 on the both side portions of the second region 40b is because the pattern of the adhesive 53 is in a gull shape and accordingly the adhesive first reaches the both side portions of the supporting member 40 when being spread by pressure. Therefore, when the adhesive pattern is formed in a different shape such that the adhesive can first reach the central portion other than the both side portions of the supporting member 40, the recess unit 45 of the supporting member 40 may be formed on the central portion of the second region 40b. Consequently, the position of the recess unit 45 may depend on the shape of an adhesive pattern coated.

Afterwards, the uniformly formed adhesive layer 52 may be hardened by applying heat or light such as infrared rays thereto, completely bonding the display panel 1 and the functional panel 50 to each other.

As described above, the present disclosure may form recess units, in which an adhesive is introduced, on a supporting member, which balances pressure when a display panel and a functional panel are bonded to each other, such that the adhesive with high viscosity can be uniformly coated on an entire region between the display panel and the functional panel.

In the meantime, the present disclosure illustrates a display device of a specific structure. For example, a specific flat display panel is illustrated as the display panel and a specific panel is illustrated as the functional panel. Also, the supporting member is illustrated to have a specific structure. However, the present disclosure may not be limited to those specific structures. For example, the display panel may be applied to every type of flat display panels which is being currently used, and also the functional panel may be applied to various functional panels, such as a 3D FPR film, a parallax barrier panel, a touch panel, a viewing angle adjusting channel and the like.

In other words, the present disclosure aims at maintaining the spread of adhesive when the display panel and the function panel are bonded to each other. Therefore, any structure may be applied to the present disclosure if the structure can satisfy the purpose. For example, even when a specific space such as a recess unit is formed on the supporting member, the number or the shape of the space may be variously determined.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A display device comprising:
   a display panel for displaying an image;
   a functional panel attached onto the display panel by an adhesive that is disposed on portions of the display panel and the functional panel;
   a supporting member at one side of the display panel, a partial area of the supporting member disposed between the display panel and the functional panel to maintain a gap between the display panel and the functional panel, the gap accommodating the adhesive; and
   at least one adhesive introduction space formed at the partial area of the supporting member so that the adhesive accommodated in the gap between the display panel and the functional panel is introduced into the adhesive introduction space,
   wherein the supporting member comprises:
   a first region disposed at a pad region of the display panel; and
   a second region disposed between the display panel and the functional panel as the partial area,
   wherein a thickness of the second region is smaller than the gap between the display panel and the functional panel so that the adhesive is accommodated in the gap between the second region and the functional panel, and
   wherein the second region includes a recess as the adhesive introduction space.

2. The device of claim 1, wherein the functional panel includes one of a Three-Dimensional Film Patterned Retarder (3D FPR), a touch panel, and a parallax barrier.

3. The device of claim 1, wherein the supporting member is made of polyethylene terephthalate.

4. The device of claim 1, further comprising a protection film on an upper surface of the functional panel.

5. The device of claim 1, wherein the adhesive is disposed on the display panel, the functional panel and the supporting member.

6. The device of claim 1, wherein the adhesive has viscosity prior to being hardened.

7. A method for fabricating a display device, the method comprising:
- providing a display panel and a functional panel;
- forming an adhesive pattern by coating an adhesive on at least one surface of the display panel and the functional panel;
- assembling the display panel, the functional panel and a supporting member such that a part of the supporting member is disposed between the display panel and the functional panel; and
- spreading the adhesive of the adhesive pattern on portions of the display panel and the functional panel by applying pressure onto the display panel and the functional panel,
- wherein a part of the adhesive reaching the supporting member is introduced into at least one adhesive introduction space formed on the part of the supporting member so that the adhesive is disposed on the portions of the display panel and the functional panel,
- wherein the supporting member comprises:
- a first region disposed at a pad region of the display panel; and
- a second region disposed between the display panel and the functional panel as the part,
- wherein a thickness of the second region is smaller than a gap between the display panel and the functional panel so that the adhesive is accommodated in the gap between the second region and the functional panel, and
- wherein the second region includes a recess as the at least one adhesive introduction space.

8. The method of claim 7, further comprising hardening the coated adhesive.

9. The method of claim 7, wherein a size of the at least one adhesive introduction space is determined by at least one of sizes of the display panel and the functional panel, a quantity of the adhesive coated, viscosity of the adhesive, strength of pressure applied onto the display panel and the functional panel.

10. The method of claim 7, wherein the formation position of the at least one adhesive introduction space in the part of the supporting member is determined according to the adhesive pattern formed on the at least one surface of the display panel and the functional panel.

11. The method of claim 7, wherein the adhesive is disposed on the display panel, the functional panel and the supporting member.

12. The method of claim 7, wherein the adhesive has viscosity prior to being hardened.

13. A supporting member for maintaining a gap between a display panel and a functional panel, the supporting member comprising:
- gap maintaining unit between the display panel and the functional panel to maintain the gap between the display panel and the functional panel; and
- at least one adhesive introduction space formed at the gap maintaining unit to be coplanar to the gap maintaining unit, and to be filled with an adhesive for attaching the display panel and the functional panel to each other,
- wherein the gap maintaining unit comprises:
- a first region configured to be disposed at a pad region of the display panel; and
- a second region configured to be disposed between the display panel and the functional panel,
- wherein a thickness of the second region is smaller than the gap between the display panel and the functional panel so that the adhesive is accommodated in the gap between the second region and the functional panel, and
- wherein the second region includes a recess as the at least one adhesive introduction space.

* * * * *